United States Patent
Lee

(10) Patent No.: US 6,459,320 B2
(45) Date of Patent: Oct. 1, 2002

(54) IMPEDANCE MATCHING CIRCUIT FOR SEMICONDUCTOR MEMORY DEVICE

(75) Inventor: Jin-Ho Lee, Seoul (KR)

(73) Assignee: Samsung Electronics Co., Ltd., Suwon (KR)

(*) Notice: Subject to any disclaimer, the term of this patent is extended or adjusted under 35 U.S.C. 154(b) by 9 days.

(21) Appl. No.: 09/824,915

(22) Filed: Apr. 3, 2001

(30) Foreign Application Priority Data

May 24, 2000 (KR) .............................. 00-28063

(51) Int. Cl.[7] .............................. H03K 5/08; G06F 5/00; G06F 13/00; G06F 13/38; H03B 1/00
(52) U.S. Cl. .............................. 327/310; 327/334; 327/108; 710/101; 710/126
(58) Field of Search .............................. 327/310, 334, 327/108; 324/549; 326/30; 710/101, 126

(56) References Cited

U.S. PATENT DOCUMENTS

| | | | |
|---|---|---|---|
| 5,448,182 A | * 9/1995 | Countryman et al. | 326/30 |
| 6,307,424 B1 | * 9/2000 | Lee | 327/530 |
| 6,141,258 A | * 10/2000 | Kawasumi | 365/189.05 |
| 6,204,683 B1 | * 3/2001 | Falconer | 326/30 |
| 6,292,014 B1 | * 9/2001 | Hedberg | 326/30 |

* cited by examiner

Primary Examiner—N. Le
Assistant Examiner—Wasseem H. Hamdan
(74) Attorney, Agent, or Firm—F. Chau & Associates, LLP

(57) ABSTRACT

An importance matching circuit for a semiconductor memory device includes an impedance detector for generating a voltage divided by a medium resistance value between a maximum resistance value and a minimum resistance value and an external resistance during a predetermined cycle as a first comparison voltage, and for generating a voltage divided by a resistance value varied in response to a counting output signal and the external resistance after the predetermined cycle as the first comparison voltage; a first comparator for comparing the first comparison voltage with a reference voltage to generate a first comparing output signal; a second comparator for comparing the first comparison voltage with the reference voltage to generate a second comparing output signal; a counter for generating the counting output signal in response to the first comparing output signal; and a plurality of output drivers for establishing an initial resistance value in each of the output drivers in response to the second comparing output signal and for adjusting a resistance value in each of the output drivers in response to the counting output signal.

17 Claims, 5 Drawing Sheets

IMPEDANCE MATCHING CIRCUIT FOR SEMICONDUCTOR MEMORY DEVICE

CROSS REFERENCE

This application claims the benefit of Korean Patent Application No. 2000-28063, filed on May 24, 2000, under 35 U.S.C. §119, the entirety of which is hereby incorporated by reference.

BACKGROUND OF THE INVENTION

1. Field of the invention

The present invention relates to semiconductor devices, and more particularly, to an impedance matching circuit for a semiconductor memory device.

2. Description of Related Art

An impedance matching circuit for a semiconductor memory device is a circuit that matches the impedance between a semiconductor memory device and an external device. A mismatch of the impedance between two signal lines or a signal line and an output driver may cause a reflected wave. Such a reflected wave results in signal distortion. To prevent the signal distortion, the impedance matching circuit is provided to match the impedance between the two signal lines or between the signal line and the output driver so that the reflected wave is absorbed.

FIG. 1 is a block diagram illustrating a conventional impedance matching circuit for a semiconductor memory device. The impedance matching circuit includes pads ZQ and DQ1 to DQn, p-channel metal oxide semiconductor (PMOS) arrays 10 and 12, an n-channel metal oxide semiconductor (NMOS) array 14, a comparator 16, a ZQ counter 18, a ZQ driver 20, data output buffer and drive units 30-1 to 30-n. The data output buffer and drive units 30-1 to 30-n include data output buffers 22-1 to 22-n and output drivers 24-1 to 24-n in such a manner that each of the data output buffer and drive units has a data output buffer and an output driver.

The PMOS array 12 and NMOS array 14 adjust their resistance values in response to a counting output signal CTQx to generate a reference voltage Vref. The reference voltage Vref may be equal to the half of a power source voltage VDDQ. The PMOS array 10 adjusts its resistance value in response to the counting output signal CTQx to generate a voltage Vzq divided by an external resistance Rzq.

The comparator 16 compares the voltage Vzq with the reference voltage Vref to generate a comparing output signal. When the voltage Vzq is higher than the reference voltage Vref, the comparator 16 generates a signal having a logic "high" level. When the voltage Vzq is smaller than the reference voltage Vref, the comparator 16 generates a signal having a logic "low" level. When a signal having a logic "high" level is inputted into the ZQ counter 18, an up-counting operation is performed. When a signal having a logic "low" level is inputted into the ZQ counter 18, a down-counting operation is performed. The ZQ counter 18 generates the counting output signal CTQx of a predetermined number of bits, and the counting output signal CTQx varies the resistance values of the PMOS array 10 and 12 and the NMOS array 14. The ZQ driver 20 drives the counting output signal CTQx from the ZQ counter 18.

Each of the data output buffers 22-1 to 22-n buffers a corresponding one of data output signal pairs DLAT1/B to DLATn/B to generate data and combines the output signal from the ZQ driver 20 and the data to generate output data.

Each of the output drivers 24-1 to 24-n adjusts its resistance value in response to the output data from a corresponding one of the data output buffers 22-1 to 22-n to output data to the data input/output pads DQ1 to DQn.

FIG. 2 is a circuit diagram illustrating the PMOS arrays 10 and 12 and the NMOS array 14 of the impedance matching circuit in FIG. 1. The PMOS array 10 includes PMOS transistors P1 to P7 connected to each other in parallel between a power source voltage VDDQ and the pad ZQ. The PMOS array 12 includes PMOS transistors P8 to P14 connected to each other in parallel between the power source voltage VDDQ and a reference voltage generating node. The NMOS array 14 includes NMOS transistors N1 to N7 connected to each other in parallel between the reference voltage generating node and a ground voltage. An inverter I is provided to invert the counting output signal CTQx so that an inverted counting output signal CTQxB is provided to the PMOS arrays 10 and 12.

In the PMOS arrays 10 and 12, gate electrodes of the PMOS transistors P1, P2, P13 and P14 are connected with the ground voltage and are always "on", and gate electrodes of the PMOS transistors P3 to P7 and P8 to P12 are connected with the inverted counting output signal CTQxB. In the NMOS array 14, gate electrodes of the NMOS transistors N6 and N7 are connected with the power source voltage VDDQ and thus are always "on", and gate electrodes of the NMOS transistors N1 to N5 are connected with the counting output signal CTQx from the ZQ counter 18.

At the beginning of the impedance matching operation, the counting output signal CTQx of the ZQ counter is "00000", and therefore, the PMOS transistors P3 to P12 and the NMOS transistors N1 to N5 are all turned off, so that the reference voltage Vref is divided by the PMOS transistors P13 and P14 and the NMOS transistors N6 and N7, and the voltage Vzq is divided by the PMOS transistors P1 and P2 and the resistance Rzq.

The comparator 16 of FIG. 1 performs a comparing operation with respect to the reference voltage Vref and the voltage Vzq to generate the comparing output signal to the ZQ counter 18 which performs up or down counting in response to the comparing output signal to generate the counting output signal CTQx to adjust the resistance values of the PMOS arrays 10 and 12 and the NMOS array 14.

FIG. 3 is a circuit diagram illustrating the output driver of the impedance matching circuit in FIG. 1. The output driver includes a PMOS array 32 that has PMOS transistors P15 to P21 connected to each other in parallel between a power source voltage VDDQ and an output signal generating node, and an NMOS array 34 that has NMOS transistors N8 to N14 connected to each other in parallel between the output signal generating node and a ground voltage.

In FIG. 3, references DOU and DOD denote output data pairs provided from a corresponding data output buffer. The output data pairs DOU and DOD are, for example, 6-bit data that are generated by combining the data generated by buffering the data applied to the data output buffer and the data generated by buffering the 5-bit data from the ZQ driver.

In FIG. 3, the data applied to gate electrodes of the PMOS transistors P15 to P19 is 5-bit data that is generated by combining data buffered with 5-bit data DOU that the output buffer outputs. The data applied to gate electrodes of the PMOS transistors P20 and P21 is 1-bit data DOU buffered by the data output buffer.

In the same way, the data applied to gate electrodes of the NMOS transistors N8 to N12 is 5-bit data DOD that is generated by combining data buffered with 5-bit data that the data output buffer outputs. The data applied to gate electrodes of the NMOS transistors N13 and N14 is 1-bit data DOD buffered by the data output buffer.

That is, the PMOS transistors P15 to P19 and the NMOS transistors N8 to N12 are turned on or off by the 5-bit counting control signal, and the PMOS transistors P20 and P21 and the NMOS transistors N13 and N14 are turned on or off by the 1-bit data buffered by the data output buffer.

Since the counting output signal is "00000" when a voltage is applied, the PMOS transistors P15 to P19 and the NMOS transistors N8 to N12 of the output driver are all turned off, so that an initial resistance value is set to become a maximum resistance value. The ZQ counter 18 can generate the counting output signal having maximum 32 steps from "00000" to "11111".

Thus, the conventional impedance matching circuit for a semiconductor memory device has the maximum resistance value when a voltage is applied and varies the resistance value from the maximum resistance value to resistance values of maximum 32 steps when an impedance matching operation is performed.

That is, the conventional impedance matching circuit for a semiconductor memory device determines the steps of the resistance value between the maximum resistance value and the minimum resistance value by a bit number of the counter. Therefore, as the difference of the resistance values between the steps becomes large, it becomes more difficult to precisely adjust the resistance value. It is possible to precisely adjust the resistance value by reducing the difference of the resistance value between the maximum resistance value and the minimum resistance value.

However, in case of increasing the bit number of the counter, since the resistance value of the output driver is adjusted in the range from the maximum resistance value to the minimum resistance value, there is such a problem that the impedance matching is completed after undergoing many steps when the resistance value is very small.

Therefore, a need exists for an impedance matching circuit for semiconductor memory devices which precisely adjusts the resistance value without increasing the bit number of the counter.

SUMMARY OF THE INVENTION

It is an object of the present invention to provide an impedance matching circuit for a semiconductor memory device that precisely adjusts a resistance value without increasing the bit number of a counter in the impedance matching circuit.

In order to achieve the above and other objects, the present invention provides an impedance matching circuit for a semiconductor memory device. The impedance matching circuit includes an impedance detecting means for generating a voltage divided by a medium resistance value between a maximum resistance value and a minimum resistance value and an external resistance during a predetermined cycle as a first comparison voltage, and for generating a voltage divided by a resistance value varied in response to a counting output signal and the external resistance after the predetermined cycle as the first comparison voltage; a first comparing means for comparing the first comparison voltage with a reference voltage to generate a first comparing output signal; a second comparing means for comparing the first comparison voltage with the reference voltage to generate a second comparing output signal; a counting means for generating the counting output signal in response to the first comparing output signal; and a plurality of output drivers for establishing an initial resistance value in each of the output drivers in response to the second comparing output signal and for adjusting a resistance value in each of the output drivers in response to the counting output signal.

The impedance detecting means preferably includes a plurality of first pull-up transistors connected to each other in parallel between a power source voltage and a node for generating the first comparison voltage and being turned on or off in response to the counting output signal; at least one second pull-up transistor connected with the power source voltage and being turned on or off in response to an output signal of a cycle detecting means; and at least one resistor connected between the at least one second pull-up transistor and the node generating the first comparison voltage, wherein a resistance value of the at least one second pull-up transistor and the at least one resistor is established to be the medium resistance value between the maximum resistance value and the minimum resistance value.

Each of the output drivers preferably includes a plurality of third pull-up transistors connected to each other in parallel and being turned on or off in response to the counting output signal; a plurality of first pull-down transistors connected to each other in parallel and connected with the plurality of the third pull-up transistors in serial, and being turned on or off in response to the counting output signal; a fourth pull-up transistor being turned on or off in response to the second comparing output signal and connected with the plurality of the third pull-up transistors in parallel; and a second pull-down transistor being turned on or off in response to the second comparing output signal and connected with the plurality of the first pull-down transistors in parallel.

In the impedance matching circuit for a semiconductor memory device according to the present invention, the resistance value of the output driver is precisely adjusted without increasing the bit number of the counter.

BRIEF DESCRIPTION OF THE DRAWINGS

For a more complete understanding of the present invention and the advantages thereof, reference is now made to the following descriptions taken in conjunction with the accompanying drawings, in which like reference numerals denote like parts, and in which.

DETAILED DESCRIPTION OF PREFERRED EMBODIMENTS

Reference will now be made in detail to preferred embodiments of the present invention, example of which is illustrated in the accompanying drawings.

Figure 1:
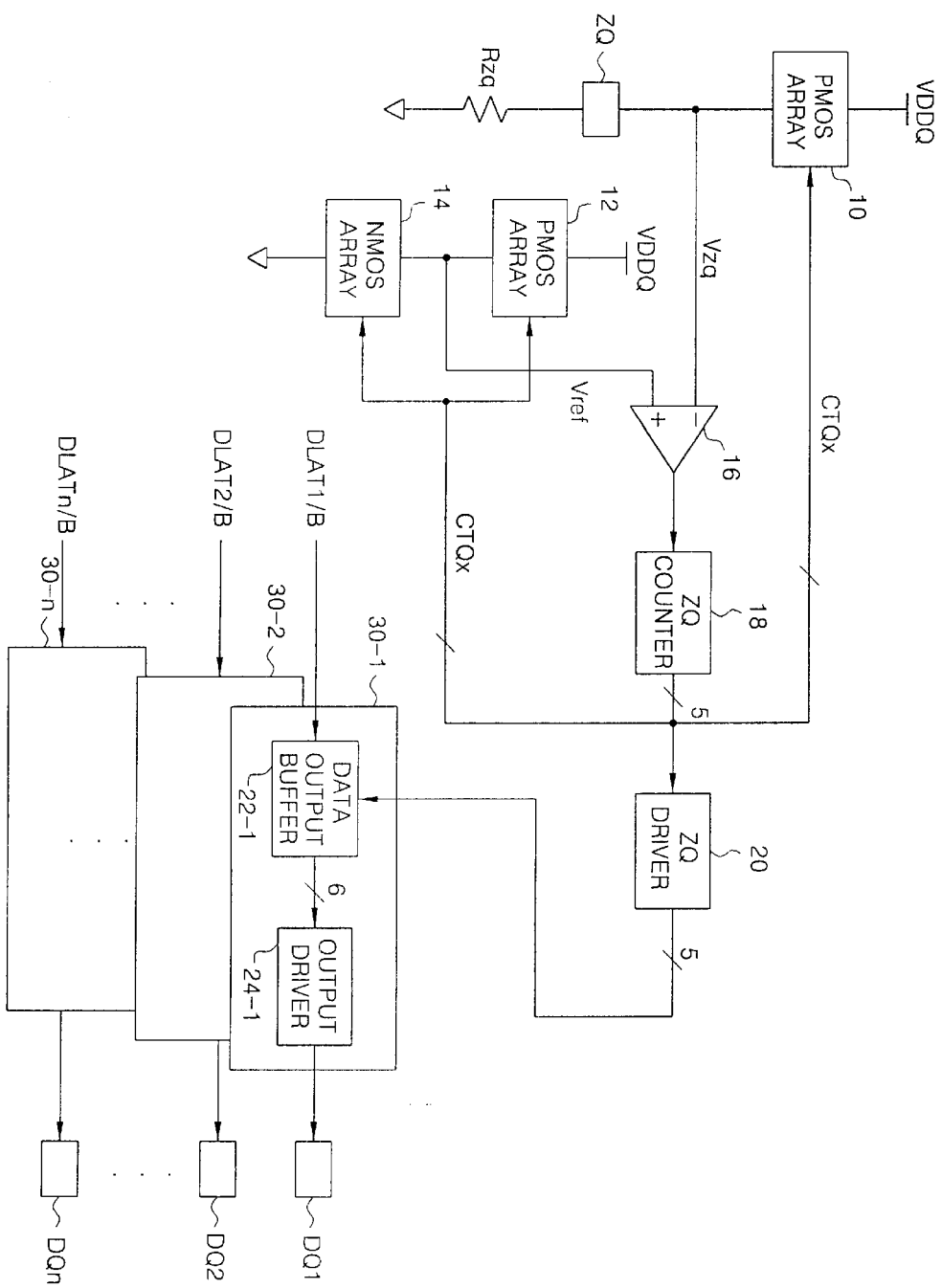
FIG. 1 is a block diagram illustrating a conventional impedance matching circuit for a semiconductor memory device.
Figure 2:
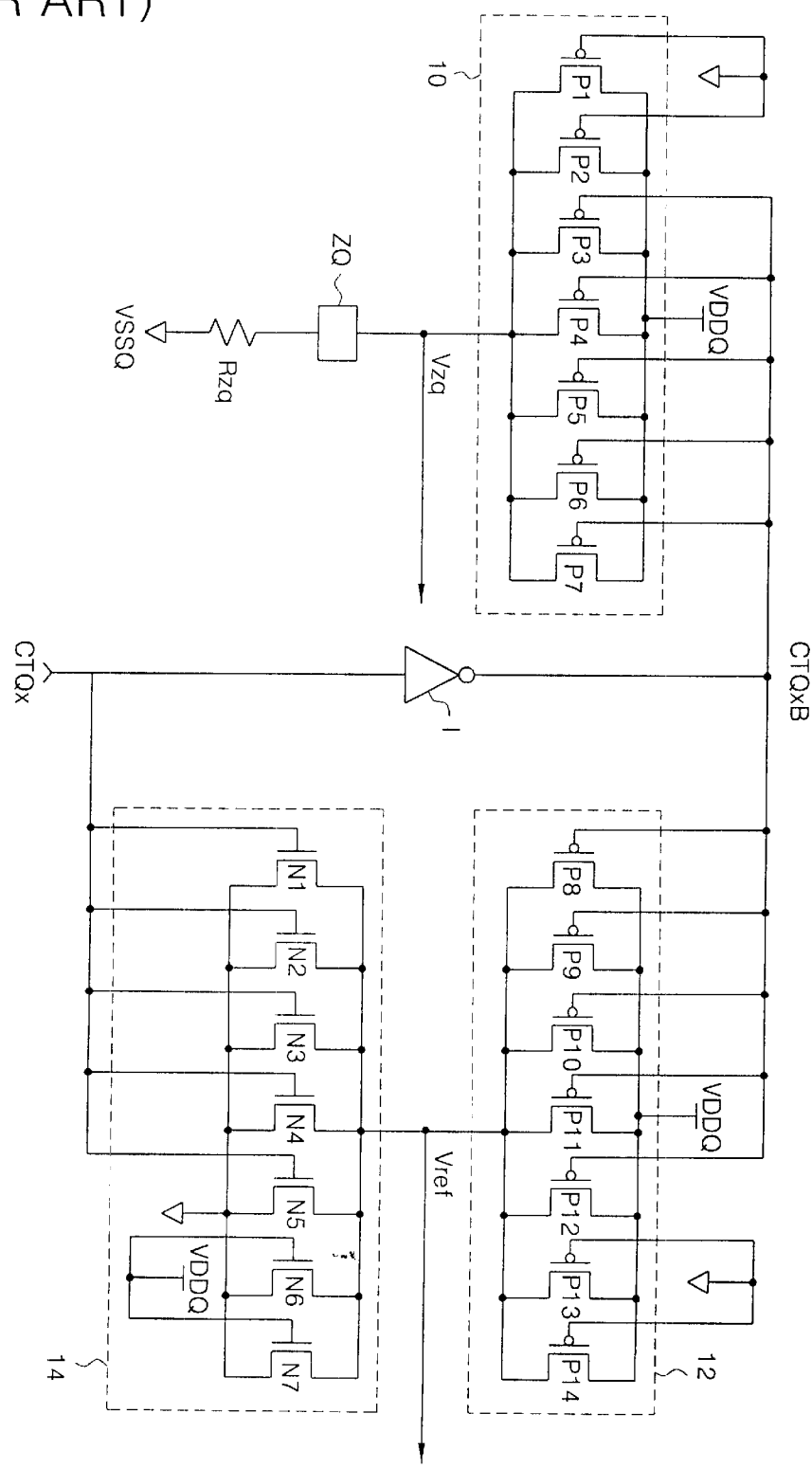
FIG. 2 is a circuit diagram illustrating the PMOS arrays and the NMOS array in FIG. 1.
Figure 4:
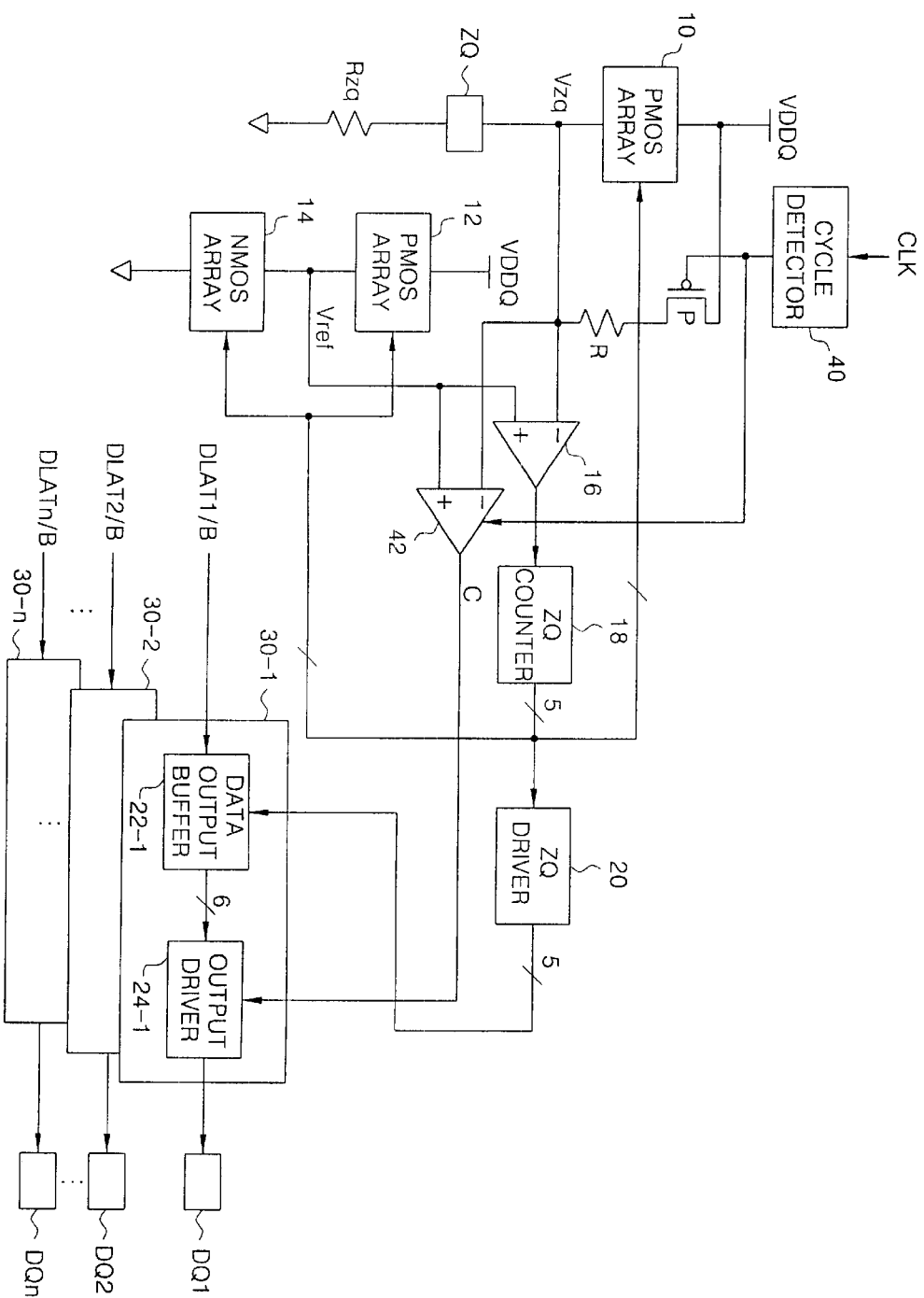
FIG. 4 is a block diagram illustrating an impedance matching circuit for a semiconductor memory device according to a preferred embodiment of the present invention.

FIG. 4 is a block diagram illustrating an impedance matching circuit for a semiconductor memory device according to the preferred embodiment of the present invention. The impedance matching circuit includes a cycle detector 40, a comparator 42, a PMOS transistor P, a resistor R, p-channel metal oxide semiconductor (PMOS) arrays 10 and 12, an n-channel metal oxide semiconductor (NMOS) array 14, a comparator 16, a counter 18, and data output buffer and drive units 30-1 to 30-n. The parts equivalent to those in FIG. 1 are represented with like reference numbers and description thereof is omitted to avoid duplicate description.

The PMOS transistor P and the resistor R are serially connected between a power source voltage VDDQ and a node for generating voltage Vzq. The cycle detector 40 detects a predetermined cycle at the first stage in response to a clock signal CLK to turn on the PMOS transistor P. The comparator 42 compares the voltage Vzq with the reference voltage Vref during the predetermined cycle detected by the cycle detector 40 to apply a comparing output to the output drivers 24-1 to 24-n.

In FIG. 4, when a voltage is applied at the first stage, the cycle detector 40 turns on the PMOS transistor P during a predetermined cycle. When the PMOS transistor P is "on", the resistance value of the PMOS transistor P and the resistance value of the resistor R are set to be a medium value between the maximum resistance value and the minimum resistance value. During the predetermined cycle, the comparator 42 generates signal C obtained by comparing the voltage Vzq and the reference voltage Vref in response to the output signal of the detector 40. For example, the signal C has a logic "high" level when the voltage Vzq is higher than the reference voltage Vref and a logic "low" level when the voltage Vzq is smaller than the reference voltage Vref. The signal C is applied to the output drivers 24-1 to 24-n to establish an initial resistance value. It should be noted that the medium value of the maximum and minimum resistance values may be set using multiple transistors and/or multiple resistors instead of using the PMOS transistor P and the resistor R.

Figure 3:
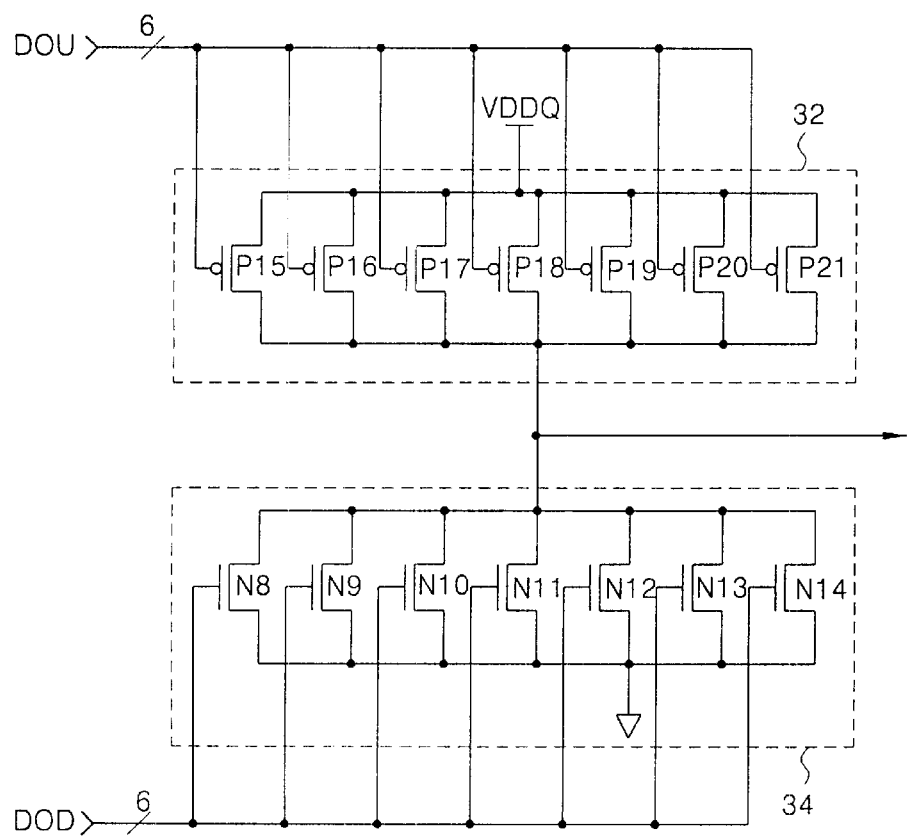
FIG. 3 is a circuit diagram illustrating one of the output drivers in FIG. 1.
Figure 5:
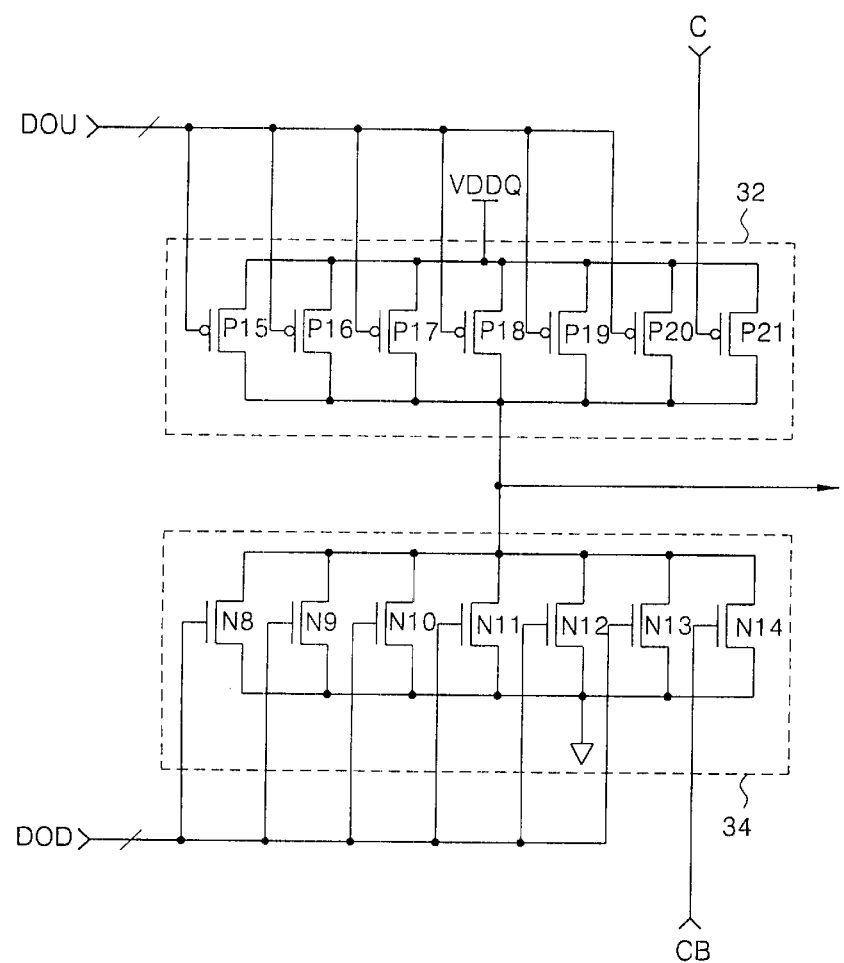
FIG. 5 is a circuit diagram illustrating a preferred embodiment of one of the output drivers in FIG. 4.

FIG. 5 is a circuit diagram illustrating a preferred embodiment of the output driver in FIG. 4. The output driver of FIG. 5 has the same configuration as that of FIG. 3 except that the PMOS transistor P21 and the NMOS transistor N14 are configured to be in response to the signals C and CB, respectively.

The comparator 42 in FIG. 4 compares the voltage Vzq with the reference voltage Vref, so that it generates the signal C having a logic "high" level when the voltage Vzq is higher than the reference voltage Vref and generates the signal C having a logic "low" level when the voltage Vzq is smaller than the reference voltage Vref, during a predetermined cycle. The signal C is inverted to the signal CB which is provided to the NMOS transistor N14. The comparator 42 may invert the signal C to generate the signal CB.

The PMOS transistor P21 and the NMOS transistor N14 of FIG. 5 are turned on or off at the first stage in response to the signals C and CB, respectively, and the state of each transistor is fixed. In other words, when the signal C has a logic "high" level, the PMOS transistor P21 and the NMOS transistor N14 are all turned off, so that the resistance value is set to be the maximum resistance value. When the signal C has a logic "low" level, the PMOS transistor P21 and the NMOS transistor N14 are all turned on, so that the resistance value is set to be (the maximum resistance value +the minimum resistance value) 2.

Therefore, the impedance matching circuit of the present invention adjusts the resistance value of the output driver, for example in 32 steps, from the maximum resistance value to (the maximum resistance value+the minimum resistance value)/2 when the voltage Vzq is higher than the reference voltage Vref at the first stage. Also, the impedance matching circuit of the present invention adjusts the resistance value of the output driver in 32 steps from (the maximum resistance value+the minimum resistance value) 2 to the minimum resistance value when the voltage Vzq is smaller than the reference voltage Vref at the first stage.

That is, the impedance matching circuit of the present invention adjusts the resistance value of the output driver in 64 steps within the range between the maximum resistance value and the minimum resistance value.

In other words, the impedance matching circuit of the present invention establishes the resistance values of the PMOS transistor P21 and the NMOS transistor N14 as a medium value and compares the voltage Vzq with the reference voltage Vref during a predetermined cycle at the first stage. When the voltage Vzq is higher than the reference voltage Vref, the comparator generates the signal C having a logic "high" level to set an initial resistance value to become the maximum resistance value. Also, when the voltage Vzq is smaller than the reference voltage Vref, the comparator generates the signal C having a logic "low" level to set the initial resistance value to become (the maximum resistance value + the minimum resistance value) 2.

Upon setting the initial resistance value, the impedance matching circuit of the present invention precisely adjusts the resistance value of the output driver in 32 steps in each half of the range between the maximum resistance value and the minimum resistance value in response to the 5-bit counting output signal from the ZQ counter.

Preferably, the impedance matching circuit of the present invention adjusts the resistance value in 32 steps in each of the two ranges, one from the maximum resistance value to (the maximum resistance value+the minimum resistance value) 2 and the other from (the maximum resistance value+the minimum resistance value) 2 to the minimum resistance value, while the conventional impedance matching circuit adjusts the resistance value in 32 steps from the maximum resistance value to the minimum resistance value.

For example, assuming that the resistance value is in the range between 40Ω and 80Ω, the conventional impedance matching circuit can adjust the resistance value in 32 steps within the range between 80Ω and 40Ω. In contrast, the impedance matching circuit of the present invention precisely adjusts the resistance value of the output driver in 32 steps in each of the two ranges, one between 60Ω and 40Ω and the other between 80Ω and 60Ω.

It is one of the advantages of the impedance matching circuit for a semiconductor memory device according to the present invention to precisely adjust the resistance value of the output driver without increasing the bit number of the counter.

While the invention has been particularly shown and described with reference to the preferred embodiments thereof, it will be understood by those skilled in the art that the foregoing and other changes in form and details may be made therein without departing from the spirit and scope of the invention.

What is claimed is:

1. An impedance matching circuit for a semiconductor memory device, comprising:

an impedance detecting means for generating a voltage divided by a medium resistance value between a maximum resistance value and a minimum resistance value and an external resistance during a predetermined cycle as a first comparison voltage, and for generating a voltage divided by a resistance value varied in response to a counting output signal and the external resistance after the predetermined cycle as the first comparison voltage;

a first comparing means for comparing the first comparison voltage with a reference voltage to generate a first comparing output signal;

a second comparing means for comparing the first comparison voltage with the reference voltage to generate a second comparing output signal;

a counting means for generating the counting output signal in response to the first comparing output signal;

a cycle detector for detecting the predetermined cycle at a beginning state of impedance matching operation to generate an output signal during the predetermined cycle; and a plurality of output drivers for establishing an initial resistance value in each of the output drivers in response to the second comparing output signal and for adjusting a resistance value in each of the output drivers in response to the counting output signal.

2. The impedance matching circuit of claim 1, wherein the impedance detecting means includes:

a plurality of first pull-up transistors connected to each other in parallel between a power source voltage and a node generating the first comparison voltage and being turned on or off in response to the counting output signal;

at least one second pull-up transistor connected with the power source voltage and being turned on or off in response to an output signal of the cycle detector; and at least one resistor connected between the at least one second pull-up transistor and the node generating the first comparison voltage, wherein a resistance value of the at least one second pull-up transistor and the at least one resistor is established to be the medium resistance value between the maximum resistance value and the minimum resistance value.

3. The impedance matching circuit of claim 2, wherein the cycle detecting means detects the predetermined cycle at a beginning stage of impedance matching operation to generate the output signal to turn on the at least one second pull-up transistor during the predetermined cycle.

4. The impedance matching circuit of claim 3, wherein the cycle detecting means provides the output signal to enable the second comparing means during the predetermined cycle.

5. The impedance matching circuit of claim 1, wherein each of the output drivers includes:

a plurality of third pull-up transistors connected to each other in parallel and being turned on or off in response to the counting output signal;

a plurality of first pull-down transistors connected to each other in parallel and connected with the plurality of the third pull-up transistors in serial, and being turned on or off in response to the counting output signal;

a fourth pull-up transistor being turned on or off in response to the second comparing output signal and connected with the plurality of the third pull-up transistors in parallel; and a second pull-down transistor being turned on or off in response to the second comparing output signal and connected with the plurality of the first pull-down transistors in parallel.

6. The impedance matching circuit of claim 5, wherein the fourth pull-up transistor and the second pull-down transistor are turned off in response to the second comparing output signal and the initial resistance value is set to the maximum resistance value, wherein the plurality of output drivers adjust the resistance value in a range between the maximum resistance value and the medium resistance value.

7. The impedance matching circuit of claim 5, wherein the fourth pull-up transistor and the second pull-down transistor are turned on in response to the second comparing output signal and the initial resistance value is set to the medium resistance value, wherein the plurality of output drivers adjust the resistance value in a range between the medium resistance value and the minimum resistance value.

8. The impedance matching circuit of claim 1, wherein the second comparing means generates the second comparing output signal to the plurality of output drivers during the predetermined cycle.

9. The impedance matching circuit of claim 8, wherein the initial resistance value is set to the maximum resistance value in response to the second comparing output signal from the second comparing means when the first comparison voltage is higher than the reference voltage.

10. The impedance matching circuit of claim 9, wherein the plurality of output drivers adjust the resistance value in each of the output drivers in a range between the maximum resistance value and the medium resistance value.

11. The impedance matching circuit of claim 10, wherein the first comparing means generates the first comparing output signal to adjust the resistance value in each of the output drivers after the predetermined cycle.

12. The impedance matching circuit of claim 8, wherein the initial resistance value is set to the medium resistance value in response to the second comparing output signal from the second comparing means when the first comparison voltage is smaller than the reference voltage.

13. The impedance matching circuit of claim 12, wherein the plurality of output drivers adjust the resistance value in a range between the medium resistance value and the minimum resistance value.

14. The impedance matching circuit of claim 13, wherein the first comparing means generates the first comparing output signal to adjust the resistance value in each of the output drivers after the predetermined cycle.

15. An impedance matching circuit for a semiconductor memory device, comprising:

an impedance detecting unit for generating a first comparison voltage of which value is divided by a medium resistance value between a maximum resistance value and a minimum resistance value and an external resistance during a predetermined cycle and divided by a resistance value varied in response to a counting output signal and the external resistance after the predetermined cycle;

a first comparator for comparing the first comparison voltage with a reference voltage to generate a first comparing output signal after the predetermined cycle;

a second comparator for comparing the first comparison voltage with the reference voltage to generate a second comparing output signal during the predetermined cycle;

a cycle detector for detecting the predetermined cycle at a beginning stage of impedance matching operation to generate an output signal during the predetermined cycle;

a counter for generating the counting output signal in response to the first comparing output signal; and a plurality of output drivers for establishing an initial resistance value in each of the output drivers in response to the second comparing output signal and for adjusting a resistance value in each of the output drivers in response to the counting output signal.

16. The impedance matching circuit of claim 15, wherein the impedance detecting unit includes:

a resistance unit for providing the medium resistance for the first comparison voltage during the predetermined cycle, the resistance unit being activated in response to the output signal from the cycle detector; and an array having a plurality of transistors each of which is turned on or off in response to the counting output signal, the array for providing the resistance value for the first comparison voltage after the predetermined cycle.

17. The impedance matching circuit of claim 15, wherein each of the output driver includes:

first transistors for providing the initial resistance value in a corresponding output driver, each of the first transistors being turned on or off in response to the second comparing output signal from the second comparator; and second transistors for adjusting the resistance value in a corresponding output driver, each of the second transistors being turned on or off in response to the counting output signal from the counter.

* * * * *